United States Patent [19]
Maruyama et al.

[11] Patent Number: 5,243,170
[45] Date of Patent: Sep. 7, 1993

[54] METHOD FOR DEPOSITION OF HEXAGONAL DIAMOND USING HYDROGEN PLASMA JET

[75] Inventors: Katsuhisa Maruyama; Mitsuo Makino; Nobuyuki Kikukawa, all of Tsukuba; Minoru Shiraishi, Kawasaki, all of Japan

[73] Assignee: Agency of Industrial Science and Technology, Tokyo, Japan

[21] Appl. No.: 660,034

[22] Filed: Feb. 26, 1991

[30] Foreign Application Priority Data
Mar. 26, 1990 [JP] Japan ................................... 2-76324

[51] Int. Cl.[5] ............................................... B23K 9/00
[52] U.S. Cl. ........................... 219/121.59; 219/121.47; 219/121.51; 427/122; 427/249; 427/446
[58] Field of Search ....................... 219/121.59, 121.47, 219/121.51, 75, 76.16; 427/34, 39, 122, 249; 118/723; 428/457, 408

[56] References Cited
U.S. PATENT DOCUMENTS
4,842,945 6/1989 Ito et al. ................................. 428/457
4,919,974 4/1990 McCune et al. ..................... 427/249
4,992,082 2/1991 Drawl et al. ......................... 428/249
5,052,339 10/1991 Vakerlis et al. ..................... 118/723
5,096,736 3/1992 Anthony et al. ....................... 427/39

Primary Examiner—Mark H. Paschall
Attorney, Agent, or Firm—Wenderoth, Lind & Ponack

[57] ABSTRACT

An improved method is proposed for providing a coating film of diamond on the surface of, for example, a cutting tool as the substrate by the plasma jet deposition method, in which the deposited diamond film has, different from the cubic crystalline structure formed under conventional conditions, a predominantly hexagonal crystalline structure so as to greatly enhance the advantages obtained by the diamond coating of the tool in respect of the hardness and smoothness of the coated surface. The improvement comprises: using hydrogen alone as the plasma-generating gas; controlling the pressure of the plasma atmosphere not to exceed 300 Torr; keeping the substrate surface at a temperature of 800°–1200° C.; and making a temperature gradient of at least 13,000° C./cm within the boundary layer on the substrate surface.

4 Claims, 1 Drawing Sheet

METHOD FOR DEPOSITION OF HEXAGONAL DIAMOND USING HYDROGEN PLASMA JET

BACKGROUND OF THE INVENTION

The present invention relates to a method for the deposition of a film of hexagonal diamond on the surface of a substrate or, more particularly, to a method for the deposition of a film of hexagonal diamond by utilizing a hydrogen plasma jet.

As is well known, it is a recently developed technology that various kinds of cutting tools and the like for working of extremely hard materials are provided with a surface coating film of diamond in an object to improve the precision of mechanical working therewith and to increase the durability of the tool edge. Such a coating film is deposited on the substrate surface as a thin layer of diamond having a crystallographically cubic structure, for example, by the plasma jet method and apparatus disclosed in Japanese Patent Kokai 1-215795 and 1-157496, according to which a plasma jet is generated by ejecting a gaseous mixture of carbon monoxide or methane as the carbon source and hydrogen and/or argon out of an anode nozzle of a special design into an arc formed by electric discharge and blown at the surface of a substrate so that a film of diamond is deposited thereon. Although the coating film of cubic diamond can be deposited in a considerably high efficiency in this known method, a problem therein is that the thus deposited diamond film consists of polycrystals of relatively coarse diamond crystallites having a diameter of 20 μm or larger so that the improvement in the cutting tool obtained thereby in the precision of mechanical working with the tool cannot be as high as desired and nicking of the tool edges would readily occur to decrease the durability of the tool. An alternative method is known for the deposition of a coating film of diamond by which the size of the diamond crystallites can be much smaller, though not small enough, but this method can hardly be used in practical applications because of the unduly low velocity of deposition on the substrate surface. Japanese Patent Kokai 63-99138 discloses a plasma CVD method for forming a hard carbonaceous coating film consisting of graphite and hexagonal diamond on the surface of a machining tool, in which the substrate at a high negative potential is held apart from the plasma-generating electrodes to produce plasma of ethylene. Although some lubricity can be imparted to the surface, the thus coated tool is not always quite satisfactory in respect of the durability because the carbonaceous coating film thus formed consists mainly of graphite with a relatively minor fraction of hexagonal diamond.

The inventors accordingly have continued extensive investigations to develop an efficient method for the deposition of a coating film of diamond on the surface of a substrate without the above described problems and disadvantages in the prior art methods. In the course of their investigations, the inventors have found that the diamond film as deposited by the plasma jet method sometimes has an at least partly hexagonal crystalline structure and got an idea to seek a possibility of obtaining a quite satisfactory coating film of diamond by utilizing fully developed hexagonal phase of diamond which is a metastable phase of diamond quite different from the ordinary cubic diamond and sometimes found in meteorites. As is taught in Science, volume 155, page 995 (1967) by R. E. Hanneman, et al., Journal of Material Science, volume 22, page 3615 (1987) by T. Sekine, et al. and elsewhere, hexagonal diamond is synthetically obtained in the form of a powder by the shock-wave pressurization method, in which intense heat and extremely high pressure are applied simultaneously to a powder of graphite, but this method is absolutely not suitable for the purpose of depositing a coating film of hexagonal diamond on the surface of a substrate. No conditions of the plasma jet method are known under which the deposited coating film of diamond has a predominantly hexagonal crystalline structure and the crystallite size thereof could be small enough.

SUMMARY OF THE INVENTION

The present invention accordingly has an object to provide an improvement in the method for the deposition of a coating film of diamond by using a plasma jet blown at the surface of a substrate, by which the film of diamond deposited on the surface could have a hexagonal crystalline structure and the crystallite size thereof could be as small as 0.1 μm or even smaller without decreasing the efficiency of deposition.

Thus, the improvement of the present invention comprises, in a plasma jet method for the deposition of a coating film of diamond having an at least partly hexagonal crystalline structure by blowing a plasma jet of a plasma-generating gas containing a gaseous carbon source compound at the surface of a substrate in a gaseous atmosphere of a reduced pressure:

(a) using hydrogen alone as the plasma-generating gas;
(b) keeping the pressure of the gaseous atmosphere in the range from 1 Torr to 300 Torr;
(c) keeping the surface of the substrate at a temperature in the range of from 800° C. to 1200° C.; and
(d) making a temperature gradient of at least 13000° C./cm within the boundary layer of the gaseous atmosphere in the vicinity of and in the direction perpendicular to the substrate surface.

DETAILED DESCRIPTION OF THE PREFERRED EMBODIMENTS

Figure 1:
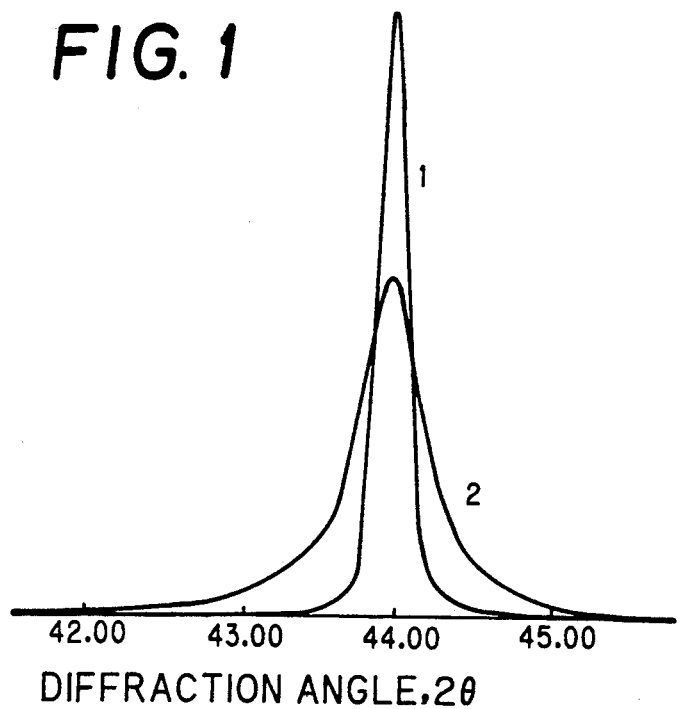
FIGS. 1, 2 and 3 each show a part of the X-ray diffraction diagrams showing the characteristic peaks from the cubic and hexagonal phases of diamond.

As is described above, the improvement provided by the invention comprises four requirements (a) to (d) and the coating film of diamond deposited on the substrate surface by the plasma jet method may have an at least partly hexagonal crystalline structure only when these requirements are satisfied. Namely, the scope of the invention comprises the atmospheric conditions that hydrogen alone is used as the gas for plasma generation by which a gaseous carbon source compound such as methane and the like is pyrolyzed in the atmosphere kept under a pressure within a specified range and the temperature conditions that the surface of the substrate is kept at a temperature in a specified range and the temperature gradient in the gaseous atmosphere exceeds a specified lower limit in the vicinity of or within the boundary layer on and in the direction perpendicular to the substrate surface.

The hydrogen plasma jet here implied is a jet stream of the plasma of hydrogen gas ejected at a high velocity from the end opening of a nozzle made from a metal such as copper as the anode with application of an electric power between the anode and a cathode made from a refractory metal of high melting point such as tungsten and molybdenum and inserted into the anode nozzle under a continuous flow of hydrogen gas through the nozzle. When a gaseous carbon source compound is introduced into the plasma jet and the plasma jet is blown at the surface of a substrate, the carbon source compound is decomposed in the plasma and deposited on the substrate surface to form a film of diamond.

In the first place, the plasma-generating gas used in the invention is hydrogen gas alone and does not contain any rare gas such as argon as in the prior art methods. This requirement is based on the fact that hydrogen gas has the largest coefficient of heat conductivity among gases so as to contribute to the increase of the temperature gradient in the vicinity of the substrate surface. When the plasma-generating gas is a mixture of hydrogen and a rare gas such as argon, the temperature gradient in the vicinity of the substrate surface cannot be large enough resulting in predominance of the cubic crystalline structure over hexagonal in the deposited film of diamond as compared with that obtained by using pure hydrogen as the plasma-generating gas.

Secondly, the pressure of the gaseous atmosphere must be kept in the range from 1 Torr to 300 Torr. Increase of the pressure over the above mentioned upper limit approaching the normal pressure is also a factor which decreases the temperature gradient in the atmosphere in the vicinity of the substrate surface resulting in predominance of the cubic crystalline structure of diamond.

Thirdly, it is essential that the surface of the substrate is kept at a temperature in the range from 800° to 1200° C. This condition can be achieved by mounting the substrate on a water-cooled substrate holder. When the temperature of the substrate surface is too high or, in particular, higher than 1400° C., graphite is formed by the pyrolysis of the carbon source compound so that the film of hexagonal diamond deposited on the substrate surface would contain a considerable amount of graphite and, by further increasing the temperature, the hexagonal diamond once formed may eventually be converted into graphite.

The surface coating film of diamond deposited according to the inventive method consists of very fine crystallites having a size of 0.1 μm or smaller. The film is formed of one or a mixture of two kinds or more of the polytypes of hexagonal diamond having various structures including those not yet identified. Accordingly, the surface of the coating film of diamond deposited by the inventive method is very smooth as compared with the coating film of cubic diamond deposited by a conventional thermal plasma method which is also efficient in the growth rate of the film. The above mentioned advantage is substantially not decreased unless the fraction of the hexagonal diamond in the deposited film is 30% or smaller. Since the diamond film deposited by the inventive method is a polycrystals of polytypism, the Mohs hardness number of the film is not lower than that alloted to a crystal of cubic diamond as the reference stone.

In the following, the method of the present invention is described in more detail by way of examples.

EXAMPLE 1

A molybdenum-made disc having a thickness of 1 mm and a diameter of 50 mm as a substrate was mounted on a water-cooled substrate holder in a plasma chamber having an inner diameter of 150 mm and a height of 300 mm and a copper-made 38 mm-long anode nozzle of a funnel-like form having a diameter of 10 mm at the upper end and 4.5 mm at the untapered 26 mm-long tubular lower portion was vertically held above the substrate at a distance of 49 mm between the lower end opening of the anode nozzle and the substrate surface. A tungsten-made rod-like cathode of 4 mm diameter was inserted into the anode nozzle.

Hydrogen gas was introduced into the anode nozzle at a rate of 80 liters (N.T.P.) per minute and methane as the carbon source gas was introduced as a pulsating flow at a rate of 2 liters (N.T.P.) per minute through a pair of oppositely facing horizontal small nozzles of 1.5 mm diameter held at a height of 10 mm below the lower end opening of the anode nozzle. The pressure inside the plasma chamber was kept at 180 Torr by the balance of continuous evacuation and introduction of the gases.

When a direct-current voltage of 100 volts was applied with a discharge current of 120 amperes between the anode nozzle and the cathode, hydrogen plasma was generated and ejected as a jet out of the lower end opening of the anode nozzle at the substrate surface. The surface of the substrate was kept at a temperature of 1050°±50° C. The temperature gradient within the boundary layer having a thickness of 0.19 mm on the substrate surface was estimated to be about 23,000° C./cm.

After 20 minutes of running in the above described manner, the substrate of molybdenum disc taken out of the plasma chamber was examined to find that a diamond film having a thickness of about 80 μm was deposited on the surface. The thus formed diamond film on the substrate surface was evaluated by the scanning electron microscopy, X-ray diffractometry and Raman spectroscopy. The results of the scanning electron microscopic study indicated that the surface of the deposited diamond film was very smooth as compared with the surface of a diamond film of the cubic crystalline structure deposited by the conventional method and the crystallites had a size of about 0.1 μm or finer.

Figure 2:
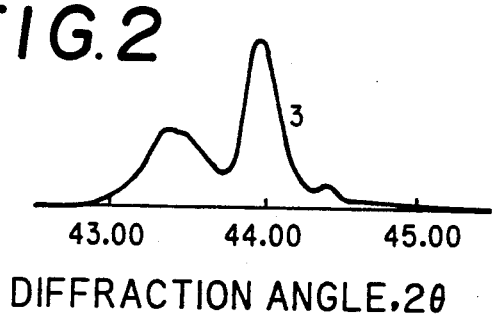
Figure 3:
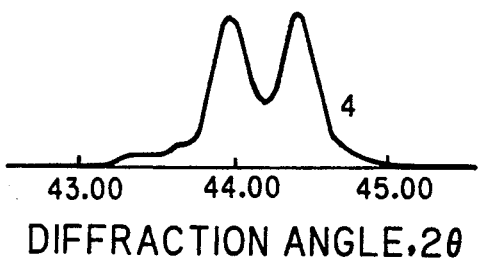

FIG. 1 of the accompanying drawing shows a part of the X-ray diffraction diagrams of a diamond film having a cubic structure (peak 1) and the diamond film obtained in this example (peak 2) determined by using $CuK_\alpha$ line. The peak 1 at about $2°\theta = 44°$ is assignable to the (111) lattice plane of the cubic diamond. The peak 2, of which the diffraction angle of the peak position is also about $2°\theta = 44°$, seemingly indicated that the diamond film obtained in the above described manner also had a cubic crystalline structure with broadening of the peak width but it could be confirmed from the results of the selected-area electron diffraction study that this peak 2 was a composite of several peaks characterizing hexagonal diamond and representing the lattice planes of (11X), in which X is 0, 1, 2, 3, and so on, the largest value of X depending on the kind of the polytype of hexagonal diamond. The peaks corresponding to such lattice planes having a lattice constant smaller or larger than (111) could be observed separately from the peak for (111) when the conditions of the hydrogen plasma jet method were modified as is shown by the curves 3 and 4 in FIGS. 2 and 3, respectively.

In the Raman spectrum of the diamond film prepared in the above described manner, two peaks at wave numbers of about 1140 $cm^{-1}$ and 1470 $cm^{-1}$, which are considered to be characteristic of hexagonal diamond, were found in the spectrum while no peak was observed at about 1133 cm$^{-1}$ which is characteristic of cubic diamond.

The result of the Mohs hardness test was that the film of hexagonal diamond deposited on the substrate surface could form scratches on a crystal of cubic diamond so that the Mohs hardness number thereof exceeded the highest in the Mohs scale.

The above described analytical results of the deposited diamond film led to a conclusion that the diamond film obtained in this example consisted of 96% of hexagonal diamond and 4% of cubic diamond.

EXAMPLE 2

The apparatus used in the hydrogen plasma jet deposition of a diamond film on the molybdenum substrate was the same as in Example 1 except that the distance between the substrate surface and the lower end opening of the anode nozzle was 44 mm instead of 49 mm. The operating conditions for the plasma jet deposition of the diamond film were also about the same as in Example 1 except that the rate of methane introduction was 3.5 liters (N.T.P.) per minute, the discharge voltage was 113 volts, the pressure inside the plasma chamber was controlled at 400 Torr, the temperature of the substrate surface was kept at 1040°±50° C. and the temperature gradient within the boundary layer having a thickness of 0.51 mm on the substrate surface was estimated to be about 12,900° C./cm.

The substrate taken out of the plasma chamber after 20 minutes of running in the above described manner was found to be coated with a film of diamond having a thickness of 80 μm. The analytical studies of this diamond film undertaken in the same manner as in Example 1 gave a conclusion that this diamond film consisted of cubic diamond only and the surface of the film was coarse and rough as being composed of crystallites of about 20 μm size.

What is claimed is:

1. In a plasma jet method for the deposition of a coating film of diamond having an at least partly hexagonal crystalline structure by blowing a plasma jet of a plasma-generating gas containing a gaseous carbon source compound at the surface of a substrate in a gaseous atmosphere of reduced pressure, the improvement which comprises conducting said deposition under the following conditions:
   (a) using hydrogen alone as the plasma-generating gas;
   (b) keeping the pressure of the gaseous atmosphere in the range from 1 Torr to 300 Torr;
   (c) keeping the surface of the substrate at a temperature in the range of from 800° C. to 1200° C.; and
   (d) making the temperature gradient of at least 13,000° C./cm within the boundary layer on and in the direction perpendicular to the substrate surface.

2. The improvement as claimed in claim 1 which further comprises:
   (e) introducing the gaseous carbon source compound into the plasma jet of hydrogen in a direction perpendicular to the stream of the plasma jet.

3. The improvement as claimed in claim 2 in which the gaseous carbon source compound is methane.

4. A diamond film deposited on the surface of a substrate having an at least partly hexagonal crystalline structure characterized by the Raman spectra at wave numbers of about 1140 cm$^{-1}$ and 1470 cm$^{-1}$, the film being deposited by the plasma jet method which comprises conducting the deposition under the following conditions:
   (a) using hydrogen alone as the plasma-generating gas;
   (b) keeping the pressure of the gaseous atmosphere in the range from 1 Torr to 300 Torr;
   (c) keeping the surface of the substrate at a temperature in the range of from 800° C. to 1200° C.; and
   (d) making a temperature gradient of at least 13,000° C./cm within the boundary layer on and in the direction perpendicular to the substrate surface.

* * * * *